(12) United States Patent
Hack et al.

(10) Patent No.: US 10,916,704 B2
(45) Date of Patent: Feb. 9, 2021

(54) VAPOR JET PRINTING

(71) Applicant: Universal Display Corporation, Ewing, NJ (US)

(72) Inventors: Michael Hack, Carmel, CA (US); William E. Quinn, Whitehouse Station, NJ (US); Gregory McGraw, Yardley, PA (US); William T. Mayweather, III, Robbinsville, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 51 days.

(21) Appl. No.: 16/292,422

(22) Filed: Mar. 5, 2019

(65) Prior Publication Data

US 2019/0305224 A1    Oct. 3, 2019

Related U.S. Application Data

(60) Provisional application No. 62/651,780, filed on Apr. 3, 2018.

(51) Int. Cl.
*H01L 51/00* (2006.01)
*C23C 16/30* (2006.01)
(Continued)

(52) U.S. Cl.
CPC ........ *H01L 51/0013* (2013.01); *C23C 16/301* (2013.01); *H01L 51/5004* (2013.01); *H01L 51/5016* (2013.01); *H01L 51/5253* (2013.01)

(58) Field of Classification Search
None
See application file for complete search history.

(56) References Cited

U.S. PATENT DOCUMENTS 4,769,292 A    9/1988 Tang
5,247,190 A    9/1993 Friend
(Continued)

FOREIGN PATENT DOCUMENTS

WO    2008057394 A1    5/2008
WO    2010011390 A2    1/2010

OTHER PUBLICATIONS

Baldo et al."Highly efficient phosphorescent emission from organic electroluminescent devices", Nature, vol. 395, pp. 151-154, 1998.
(Continued)

*Primary Examiner* — Angel Roman
(74) *Attorney, Agent, or Firm* — Butzel Long

(57) ABSTRACT

Embodiments of the disclosed subject matter provide systems and methods of depositing a film on a selective area of a substrate. A first jet of a first material may be ejected from a first nozzle assembly of a jet head having a plurality of nozzle assemblies to form a first portion of a film deposition on the substrate. A second jet of a second material may be ejected from a second nozzle assembly of the plurality of nozzle assemblies, the second nozzle assembly being aligned with the first nozzle assembly parallel to a direction of motion between the plurality of nozzle assemblies and the substrate, and the second material being different than the first material. The second material may react with the first portion of the film deposition to form a composite film deposition on the substrate when using reactive gas precursors.

20 Claims, 9 Drawing Sheets

(51) Int. Cl.
*H01L 51/50* (2006.01)
*H01L 51/52* (2006.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0230980 A1 | 12/2003 | Forrest |
| 2004/0174116 A1 | 9/2004 | Lu |
| 2014/0161968 A1* | 6/2014 | Kang ............... H05B 33/10 427/66 |
| 2015/0190832 A1* | 7/2015 | Yi ..................... B05C 9/12 427/553 |
| 2016/0068953 A1 | 3/2016 | Li |
| 2017/0101711 A1* | 4/2017 | McGraw ........... C23C 14/243 |
| 2017/0189934 A1* | 7/2017 | Zou ................. H01L 51/0003 |
| 2017/0229663 A1 | 8/2017 | Tsai |
| 2019/0011758 A1* | 1/2019 | Lee ................. G02F 1/133514 |
| 2019/0067395 A1* | 2/2019 | Kondo ............. H01L 51/5246 |
| 2020/0119277 A1* | 4/2020 | Cheon ............... C23C 16/44 |
| 2020/0152717 A1* | 5/2020 | Hwang ............. H01L 51/5253 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

VAPOR JET PRINTING

CROSS-REFERENCE TO RELATED APPLICATIONS

This application claims priority to U.S. Patent Application Ser. No. 62/651,780, filed Apr. 3, 2018, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a method of depositing a film on a selective area of a substrate may be provided. A first jet of a first material may be ejected from a first nozzle assembly of a jet head comprising a plurality of nozzle assemblies to form a first portion of a film deposition on the substrate. A second jet of a second material may be ejected from a second nozzle assembly of the plurality of nozzle assemblies, the second nozzle assembly being aligned with the first nozzle assembly parallel to a direction of motion between the plurality of nozzle assemblies and the substrate, and the second material being different than the first material. The second material may react with the first portion of the film deposition to form a composite film deposition on the substrate when using reactive gas precursors.

Each nozzle of the plurality of nozzle assemblies may include jetting apertures, exhaust apertures, and confinement apertures, and a jetting flow ejected from the jetting apertures may be perpendicular to the substrate, and a confinement flow ejected from the confinement apertures may be parallel to the substrate. A shape and a thickness profile of the composite film deposition, and the selective area of the substrate upon which the composite film deposition is formed, may be based on a size and shape of the first nozzle assembly and the second nozzle assembly, and a distance between the jet head and the substrate.

The selective area of the substrate upon which the composite film deposition is formed may be less than 50% of the surface area of the substrate, and may be less than 10% of the surface area of the substrate. A size of the jet head may be less than 10% of a surface area of the substrate. At least one of a length and width dimension of the jet head may be less than 25% of at least one of a length and width dimension of the substrate. The distance between the substrate and the jet head may be 10-100 μm, but may extend up to 1 mm for low resolution printing applications.

The composite film deposition may include at least one of an inorganic film, a metal film, and an organic film. The composite film deposition may be formed by using at least one of an atomic layer deposition (ALD), an atomic layer epitaxy (ALE), a chemical vapor deposition (CVD), plasma enhanced chemical vapor deposition (PECVD), and remote plasma enhanced chemical vapor deposition (RPECVD). The composite film deposition may form a multi-layer barrier film over at least a portion of an organic light emitting device (OLED). The composite film deposition may include at least one of Group III-V materials. The Group III-V materials may be deposited using a showerhead having separate gas pathways for the Group III materials and the Group V materials. The composite film deposition may be formed from at least one of GaAs, AlAs, InGaAs, InP, InGaAlP, GaN, AlGaN, GaInN, and AlN. The composite film deposition may be a three-dimensional structure of at least one material selected from an organic material, an inorganic material, a metallic material, and a dielectric material. The composite film deposition may be a spatially-localized thin film transistor, a light emitting device, or an organic light emitting device.

The method may include detecting, with a sensor, one or more surface features of a device, where the composite film deposition is formed on the one or more detected surface features of the device. One of the detected surface features may be a surface defect.

An embodiment of the disclosed subject matter may provide a device to deposit a film on a selective area of a substrate. The device may include a jet head having a plurality of nozzle assemblies. The plurality of nozzle assemblies may include a first nozzle assembly to eject a first jet of a first material to form a first portion of a film deposition on the substrate, and a second nozzle assembly to eject a second jet of a second material, the second nozzle assembly being aligned with the first nozzle assembly parallel to a direction of motion between the plurality of nozzle assemblies and the substrate, and the second material being different than the first material. The second material may react with the first portion of the film deposition to form a composite film deposition on the substrate when using reactive gas precursors.

Each nozzle of the plurality of nozzle assemblies may include of jetting apertures, exhaust apertures, and confinement apertures, and a jetting flow ejected from the jetting apertures is perpendicular to the substrate, and a confinement flow ejected from the confinement apertures is parallel to the substrate. A deposition channel in each of the plurality of print head assemblies may be in fluid communication with the jetting apertures. Exhaust channels, in fluid communication with the exhaust apertures, may be disposed adjacent to each deposition channel. Confinement channels, in fluid communication with the confinement apertures, may be disposed between the exhaust channels.

A shape and a thickness profile of the composite film deposition, and the selective area of the substrate upon which the composite film deposition is formed, may be based on a size and shape of the first nozzle assembly and the second nozzle assembly, and a distance between the jet head and the substrate. The nozzle assemblies that eject the first material and the second material may be surrounded by a perimeter of inert convectors that do not emit reactive gasses.

According to an embodiment, a method of depositing films on a selective area of a substrate may rely on different source gases that react at or close to a deposition site may be provided. A first jet of a first material may be ejected from a first nozzle assembly of a jet head that is separate from a second nozzle assembly of the jet head. On a surface of the substrate, a first layer deposition may be formed using the first material. The substrate or the jet head may be moved a distance corresponding to a spacing between the first nozzle assembly and the second nozzle assembly. A second jet of a second material may be ejected from the second nozzle assembly of the jet head. The second nozzle assembly may be aligned with the first nozzle assembly parallel to a direction of motion between the plurality of nozzle assemblies and the substrate. The second material may react with the first portion of the film deposition to form a composite film deposition on the substrate when using reactive gas precursors.

The first nozzle assembly and the second nozzle assembly may be confined from one another. Each nozzle of a plurality of nozzle assemblies of the jet head may include jetting apertures, exhaust apertures, and confinement apertures, and a jetting flow ejected from the jetting apertures may be perpendicular to the substrate, and a confinement flow ejected from the confinement apertures may be parallel to the substrate. A shape and a thickness profile of the composite film deposition, and the selective area of the substrate upon which the composite film deposition is formed, may be based on a size and shape of the first nozzle assembly and the second nozzle assembly, and a distance between the jet head and the substrate.

The substrate or the jet head may be moved the distance corresponding to the spacing between the first nozzle assembly and the second nozzle assembly. The composite film deposition may be added to using the first material that is emitted from the first nozzle assembly.

The first nozzle assembly and the second nozzle assembly may form a nozzle assembly pair, where a number of nozzle assembly pairs of the plurality of nozzle assemblies may be equal to a film thickness divided by a bi-layer atom thickness.

The selective area of the substrate upon which the composite film deposition is formed may be less than 50% of the surface area of the substrate, and may be less than 10% of the surface area of the substrate. A size of the jet head may be less than 10% of a surface area of the substrate. At least one of a length and width dimension of the jet head may be less than 25% of at least one of a length and width dimension of the substrate. The distance between the substrate and the jet head may be 10-100 µm, but may extend up to 1 mm for low resolution printing applications.

The composite film deposition may include at least one of an inorganic film, a metal film, and an organic film. The composite film deposition may be formed using at least one of an atomic layer deposition (ALD), an atomic layer epitaxy (ALE), a chemical vapor deposition (CVD), plasma enhanced chemical vapor deposition (PECVD), and remote plasma enhanced chemical vapor deposition (RPECVD). The composite film deposition forms a multi-layer barrier film over at least a portion of an organic light emitting device (OLED). The composite film deposition may be a spatially-localized thin film transistor, a light emitting device, or an organic light emitting device.

The method may include detecting, with a sensor, one or more surface features of a device, where the composite film deposition is formed on the one or more detected surface features of the device. One of the detected surface features may be a surface defect.

According to an embodiment, a system may be provided to deposit a film on a selective area of a substrate. A jet head having a plurality of nozzle assemblies may include a first nozzle assembly to eject a first jet of a first material to form, on a surface of the substrate, a first layer deposition using the first material, and a second nozzle assembly to eject a second jet of a second material when the substrate or the jet head is moved a distance corresponding to a spacing between the first nozzle assembly and the second nozzle assembly. The second nozzle assembly may be aligned with the first nozzle assembly parallel to a direction of motion between the plurality of nozzle assemblies and the substrate. The second material may react with the first portion of the film deposition to form a composite film deposition on the substrate when using reactive gas precursors.

The first nozzle assembly of a jet head may be separate from a second nozzle assembly of the jet head, where the first nozzle assembly and the second nozzle assembly are confined from one another, and where each nozzle of a plurality of nozzle assemblies of the jet head is comprised of jetting apertures, exhaust apertures, and confinement apertures, and a jetting flow ejected from the jetting apertures is perpendicular to the substrate, and a confinement flow ejected from the confinement apertures is parallel to the substrate. A shape and a thickness profile of the composite film deposition, and the selective area of the substrate upon which the composite film deposition is formed, may be based on a size and shape of the first nozzle assembly and the second nozzle assembly, and a distance between the jet head and the substrate. The first nozzle assembly and the second nozzle assembly may form a nozzle assembly pair, wherein a number of nozzle assembly pairs of the plurality of alternating nozzles is equal to a film thickness divided by a bi-layer atom thickness.

According to an embodiment, a method of depositing a film on a selective area of an object may be provided. The method may include switching between a source for a first gas and a second gas. The first gas may be ejected from a first nozzle assembly of a jet head having a plurality of nozzle assemblies, and the second gas may be ejected from a second nozzle assembly of the jet head, where the second nozzle assembly is aligned with the first nozzle assembly parallel to a direction of motion between the plurality of nozzle assemblies and the object. The method may include forming, on a surface of the object, a composite film deposition by alternating the exposure of the surface of the object to the first gas and the second gas by the switching, where the composite film deposition is formed using reactive gas precursors.

Each nozzle of the plurality of nozzle assemblies is comprised of jetting apertures, exhaust apertures, and confinement apertures, and a jetting flow ejected from the jetting apertures is perpendicular to the object, and a confinement flow ejected from the confinement apertures is parallel to the object.

A shape and a thickness profile of the composite film deposition, and the selective area of the object upon which the composite film deposition is formed, may be based on a size and shape of the first nozzle assembly and the second nozzle assembly, and a distance between the jet head and the object. The object may be a substrate or a device.

The selective area of the object upon which the composite film deposition is formed may be less than 50% of the surface area of the object, and may be less than 10% of the surface area of the object. A size of the jet head may be less than 10% of a surface area of the object. At least one of a length and width dimension of the jet head may be less than 25% of at least one of a length and width dimension of the object. The distance between the object and the jet head may be 10-100 µm, but may extend up to 1 mm for low resolution printing applications. The formed composite film deposition may include at least one of an inorganic film, a metal film, and an organic film.

The composite film deposition may be formed using at least one of an atomic layer deposition (ALD), an atomic layer epitaxy (ALE), a chemical vapor deposition (CVD), plasma enhanced chemical vapor deposition (PECVD), and remote plasma enhanced chemical vapor deposition (RPECVD). The composite film deposition may form a multi-layer barrier film over at least a portion of the device that is an organic light emitting device (OLED).

According to an embodiment, a system to depositing a film on a selective area of an object may be provided. The system may include a first source for a first gas, a second source for a second gas, and a switch to select between the first source and the second source. The first gas may be ejected from a first nozzle assembly of a jet head comprising a plurality of nozzle assemblies, and the second gas may be ejected from a second nozzle assembly of the jet head. The second nozzle assembly may be aligned with the first nozzle assembly parallel to a direction of motion between the plurality of nozzle assemblies and the object. A composite film deposition may be formed on a surface of the object by alternating the exposure of the surface of the object to the first gas and the second gas using the switch. The composite film deposition may be formed using reactive gas precursors.

Each nozzle of the plurality of nozzle assemblies may include of jetting apertures, exhaust apertures, and confinement apertures, and a jetting flow ejected from the jetting apertures is perpendicular to the object, and a confinement flow ejected from the confinement apertures is parallel to the object. A shape and a thickness profile of the composite film deposition, and the selective area of the object upon which the composite film deposition is formed, may be based on a size and shape of the first nozzle assembly and the second nozzle assembly, and a distance between the jet head and the object.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
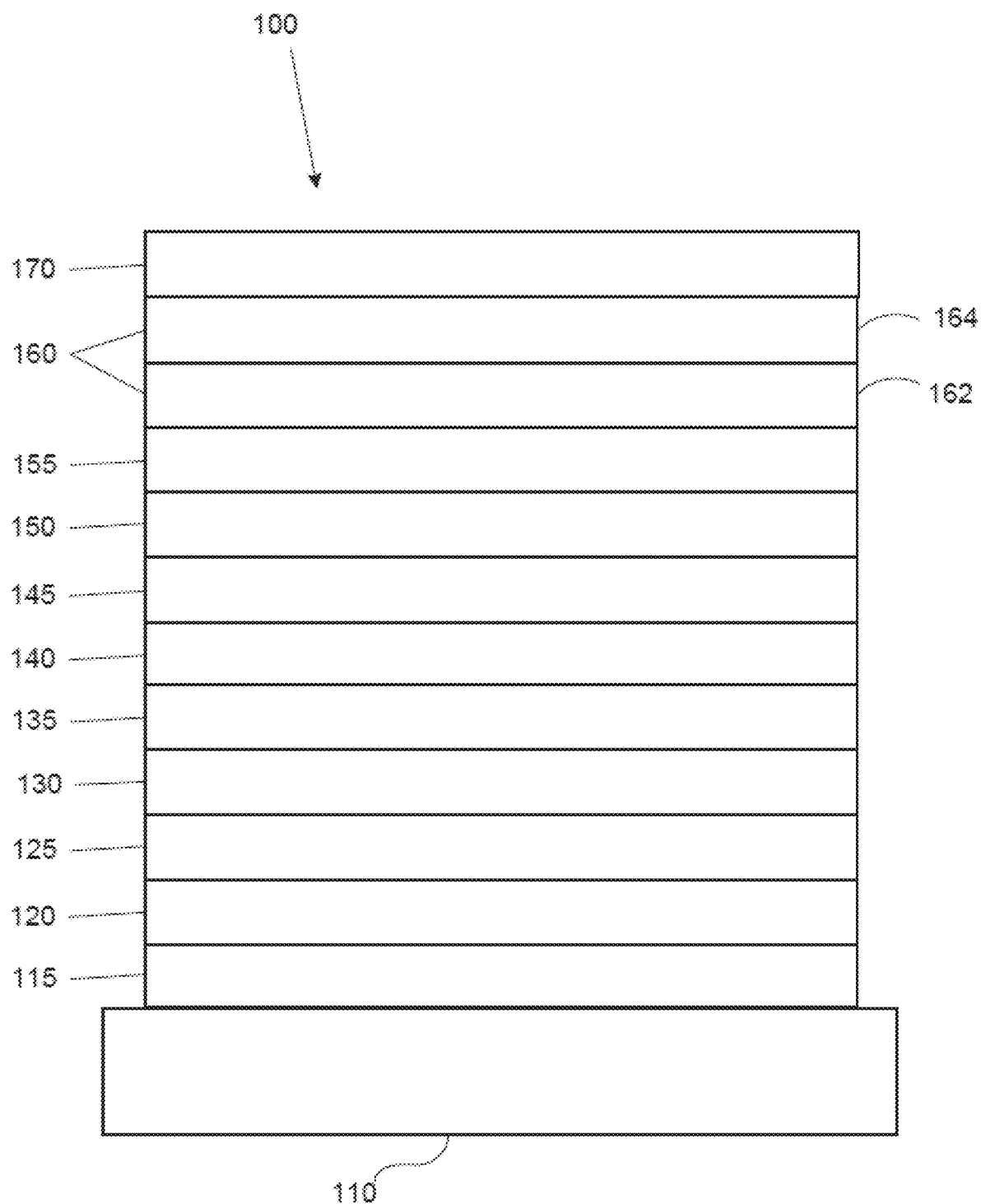
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
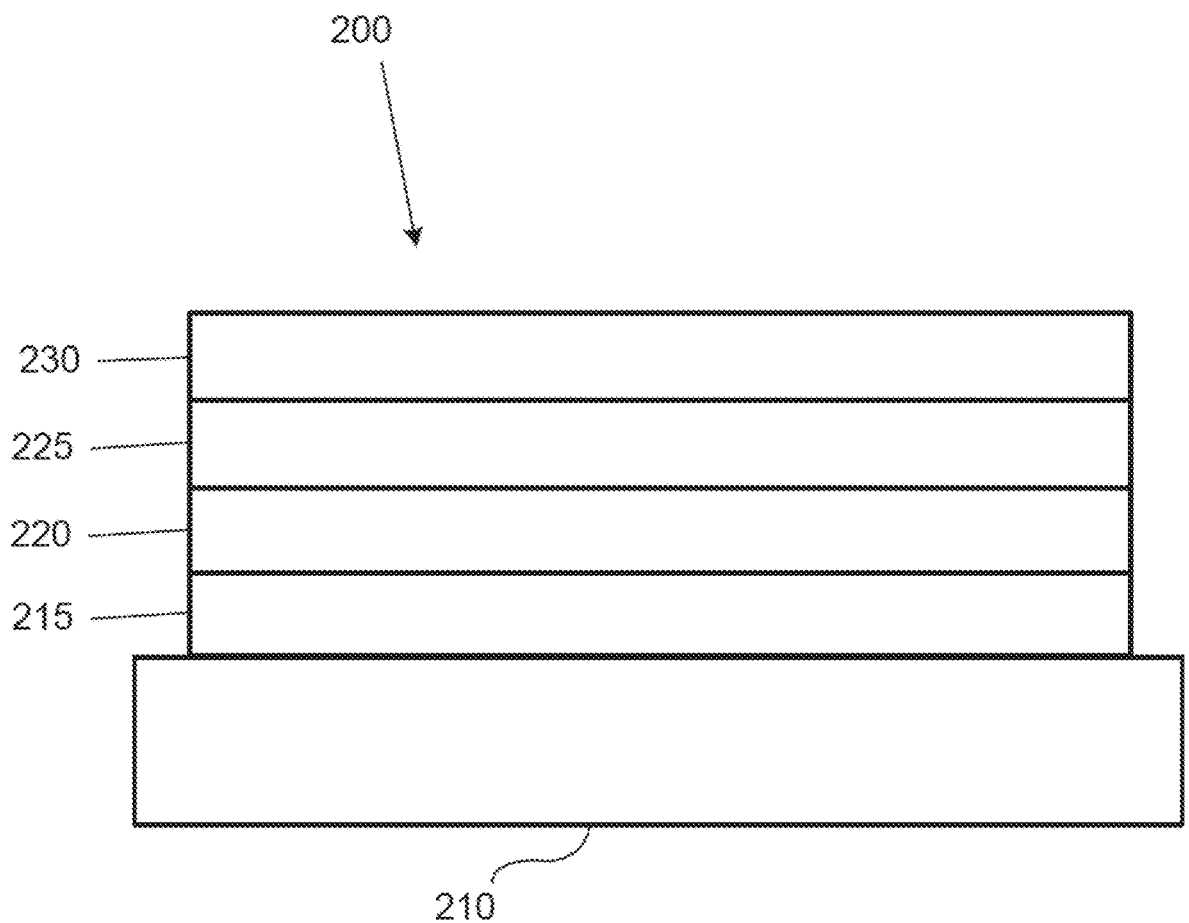
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Embodiments of the disclosed subject matter may provide OLED (organic light emitting device) encapsulation by alternating deposition channels in a Confined Organic Printing (COP) type device to produce aluminum oxide. This may be similar to forming an atomic deposition layer (ALD). Because of the small size of the deposition channels and the isolation between channels, a growth rate may be very rapid. This may address one of the biggest problems for ALD encapsulation, which is slow growth rate. Using the micro-CVD (chemical vapor deposition) printing aperture system discussed throughout, encapsulation may be used to form features and/or cover defects or particles on a device, a display, or the like.

Embodiments of the disclosed subject matter may provide local encapsulation. For example, ALD or multi-layer stack (that may be, for example, organic, inorganic, ALD, a combination thereof, or the like) over selective areas of a display and/or device to add specific strength to local areas. For example, the ALD and/or multi-layer stack may be added along the fold region of a foldable OLED display. Micro-ALD or micro-ALE (atomic layer epitaxy) may provide close spacing of deposition channels to provide a high growth rate.

High aluminum content Group III-nitride materials may be difficult to grow rapidly due to gas phase interaction between trimethyl aluminum and ammonia. In embodiments of the disclosed subject matter, using a depositor-exhaust-confinement type (DEC-type) showerhead, extremely high growth rates may be achieved, which may be beneficial for forming deep ultraviolet light emitting devices (e.g., for purification purposes).

Embodiments of the disclosed subject matter may provide selective area deposition by micro CVD. A DEC-type print aperture may be used to print materials in the same manner as ink jet, but using CVD materials and technique (e.g., by using cold gas and a hot substrate). This could be used, for example to "print" optical elements on silicon devices. Although some initiatives have attempted to do this with bulk films, small structures may be easier to grow using lattice mis-matched materials.

Implementations of the disclosed subject matter may be used to form organic TFTs (thin film transistors) for display backplanes, where it may be desirable to cover a small portion of the pixel area. Embodiments of the disclosed subject matter may also use Plasma Enhanced Chemical Vapor Deposition (PECVD), or micro PECVD.

Embodiments of the disclosed subject matter may provide additive deposition of thin films of different materials to form and/or build up three-dimensional (3D) stacks. Locally deposited thin films may be used to repair holes and/or other defects in existing films.

Some prior systems, such as described in U.S. Patent Publn. No. 2016/0068953, require separate pressure gages and controllers for each exhaust channel. In contrast, embodiments of the disclosed subject matter provide configurations with small dimensions that are controlled by flow restriction in the exhaust channels.

In some embodiments, a similar concept to those described above may be used for Group III-V epitaxy, where TMA (trimethyl aluminum) may react with ammonia in the gas phase. The highest quality material and fastest growth rates may be achieved when TMA and $NH_3$ do not mix in the gas phase.

Group III-V materials may be separated in the delivery system that may include a "showerhead." Typically, the Group III and Group V materials may mix in the gas space between the showerhead and substrate. For AlN, the TMA and $NH_3$ may react in the gas phase to form adducts, which may reduce the growth rate (as it consumes TMA) and creates particles. Injecting TMA and $NH_3$ in separate regions minimizes the issue of reduction in growth rate. Using DEC, such a reduction in growth rate may be eliminated.

There may be applications where it is desirable to accurately deposit or print thin films on a specific location on a substrate. Vapor jet printing may lower printing costs by applying materials in a particular location, as opposed to coating a complete substrate. The use of a small monolithic printing head assembly may reduce heating from a hot printing head to a substrate, which can avoid damage to devices already deposited on to the substrate. This is because in VJP or spatial ALD (atomic layer deposition), source-to-substrate distances may be less than 1 mm, so if a large print head is heated to high temperatures (e.g., 300° C.) and placed less than 1 mm from a substrate for a plurality of seconds, the substrate surface may heat.

The use of DEC print heads may enable the deposition of films that use different source gases that react at, or close to, a deposition site. For example, in ALD, a first gas may be placed on a substrate for a monolayer deposition. When the first gas is removed and a second gas is applied to the same location, a monolayer growth may occur when the second gas reacts with the surface layer deposited from the first gas. These operations may be repeated to build up monolayers of film. Spatial ALD may benefit from DEC VJP technology to avoid mixing of gases prior to the gasses meeting at the growth site. Use of a monolithic print head may provide pinpoint and/or line deposition over one or more selective areas of a substrate to avoiding wasting material.

The two gases may be introduced to the growing surface by several approaches. Firstly, multiple heads may be used, each jetting a different gas and aligned such that a nozzle from one jet head emitting gas A is aligned with a nozzle from a second jet head emitting gas B. The growing surface may experience a series of ABAB gas exposures to grow an ALD film. A second approach may have one jet head with alternating ABABAB nozzles confined from each other. The substrate or print head may be moved a distance corresponding to the nozzle spacing, so the second source gas may reach the growing surface. The assembly may then may be moved back to have the first source gas jetted on to the growing surface. In some embodiments, a plurality of alternating nozzles may be stacked to yield a desired film thickness on one printing pass. The number of pairs of nozzles may be equal to a film thickness divided by the bi-layer atom thickness. A third approach could be to have the gases coming out of the nozzle switched at the source to create an ABAB growth pattern on the substrate surface. The advantages of using monolithic assembly VJP for spatial ALD is that the small volumes inherent in VJP may provide fast purging times and deposition rates, unlike conventional ALD where the purging times to remove one gas before another is introduced lead to low deposition rates. Another advance of using monolithic assembly VJP for spatial ALD is for high utilization of material. Both of these features may reduce production costs.

Many devices, particularly organic devices such as OLEDs, solar cells, and transistors, may be sensitive to air and moisture, and thin film barrier films may be deposited on such devices to provide isolation. One such encapsulation approach may use ALD, as described above. For OLEDs, a multi-layer system having dyads or pairs of alternating films may be used, where one film is organic and one film is inorganic. In some embodiments, a single layer barrier with both organic and inorganic properties in the same film may be used. The approaches described above may be used to produce a multi-layer system with nozzle A producing a deposition, for example, of inorganic barrier film, and a second nozzle B producing an organic film. Using one of the three operations discussed above, a multi-layer film may be grown. This may rely on CVD or remote plasma PECVD processes for individual film deposition.

As ALD encapsulation may have very high quality, one approach may be to coat an OLED with a blanket thin film encapsulation, and then apply an ALD based system locally using VJP in regions where it is desirable to have a very high quality film, such as for a foldable AMOLED display, along the region which will undergo repetitive folding.

Vapor deposition of III-V materials such as GaAs, AlAs, InGaAs, InP, InGaAlP, GaN, AlGaN, GaInN, and AlN may be deposited using showerheads. The Group III materials and Group V materials may have separate gas pathways. The Group III and Group V materials mix in the gas phase between the vapor injector and heated substrate. Trimethyl aluminum is particularly reactive with the Group V precursors (e.g., arsine, phosphine, or ammonia) and may react in the gas space between the substrate and gas injector. Any adducts formed may reduce the efficiency of material utilization and may produce particulates if the adducts grow to sufficient size. In the case of AlN, the adduct formation may limit the growth rate of AlN to less than 1 μm/hour. In some deposition systems, increasing the flow of TMA may reduce the growth rate due to an increase in the rate of adduct formation. In one embodiment, the formation of adducts may be minimized by adding a purge flow between the TMA and $NH_3$ injectors to minimize gas phase mixing.

Using DEC print heads for Group III-V epitaxy may eliminate the issue of efficiency of material utilization and the production of particulates. Gas phase mixing may be eliminated by the introduction of exhaust channels adjacent to each deposition channel and adding a confinement channel between exhaust channels. The sequence of channels may be: C-E-TMA-E-C-E-NH3-E (where C=Confinement, and E=Exhaust). This sequence may be repeated a plurality of times to increase growth rate in a linear system, or may be spaced radially in the case of a showerhead-type system with a rotating susceptor.

Chemical vapor deposition (CVD) processes and plasma assisted CVD may be applied to local regions of a substrate using gases ejected from nozzles of a VJP system. Advantages of this arrangement may include high material utilization by particular coating regions of need.

CVD is a chemical process that may be used to produce high quality, high-performance, solid materials. The process may be used in the semiconductor industry to produce thin films. In typical CVD, the wafer (substrate) may be exposed to one or more volatile precursors, which react and/or decompose on the substrate surface to produce the desired deposit. Frequently, volatile by-products are also produced, which may be removed by gas flow through the reaction chamber.

Microfabrication processes may use CVD to deposit materials in various forms, including: monocrystalline, polycrystalline, amorphous, and epitaxial. These materials may include: silicon (e.g., $SiO_2$, germanium, carbide, nitride, oxynitride), carbon (e.g., carbon fiber, nanofibers, nanotubes, diamond, and graphene), fluorocarbons, filaments, tungsten, titanium nitride and various high-k dielectrics.

CVD may be performed in a variety of process formats. These processes generally differ in how the chemical reactions may be initiated. For example, CVD may be classified by the type of substrate heating, such as hot wall CVD, in which the chamber is heated by an external power source and the substrate is heated by radiation from the heated chamber walls. With another type of substrate heating, such as cold wall CVD, the substrate may directly heated either by induction or by passing current through the substrate itself or a heater in contact with the substrate. The chamber walls may be at room temperature.

CVD may be classified by the type of plasma processing used. For example, CVD may be classified as microwave plasma-assisted CVD (MPCVD). CVD may be classified as Plasma-Enhanced CVD (PECVD), which may utilize plasma to enhance chemical reaction rates of the precursors. PECVD processing may allow for deposition at lower temperatures, which may be beneficial in the manufacture of semiconductors. The lower temperatures may allow for the deposition of organic coatings, such as plasma polymers, that have been used for nanoparticle surface functionalization. CVD may also be classified as remote plasma-enhanced CVD (RPECVD), which may be similar to PECVD except that the wafer substrate is not directly in the plasma discharge region. RPECVD may include removing the wafer from the plasma. This approach may enable micro PECVD using VJP, given the very small dimensions of the system, which may not allow a plasma to be struck between ejection nozzle and substrate.

Three-dimensional (3D) printing, which may be used to fabricate 3D structures, is based on printing a range of materials from a liquid form. VJP may be used to form complex 3D structures having a plurality of materials deposited from a vapor, as opposed to liquid form. Such materials could be organic, metallic, dielectric, or the like. Stacks of alternating materials may not be limited to similar materials, such as inorganics on top of inorganics (ALD of $Al_2O_3$). Organics may be deposited on top of inorganics, metals, or oxides to form composite multi-layer structures.

Large area devices may often have defects arising from particulates. For organic devices which are very sensitive to the environment, any pin holes in the thin film encapsulation barrier protecting them from ambient conditions may lead to black spots and degradation of the organic devices. Encapsulation films deposited by VJP may be used the seal any pin-holes when they are detected. Detection and encapsulation may be performed locally relatively quickly, without needing to coat the whole device area. If a defect or black spot is detected from a test where all pixels of a device are illuminated, the location of the defect or black spot may be noted and the device may be placed into a VJP chamber and the jet head placed over the detected defective area to re-seal it and prevent further degradation. This may increase the yield of fabricating very large area devices, where the probability of defects and/or pin holes becomes significant and the cost of rejecting a device or display is also high, making repair desirable. This approach may be used with any device having pin holes and/or defects in a thin film barrier layer.

An array of patterned thin film features comprised of compound material formed from reactive gas precursors may be deposited by VJP using a grid of isolated convective cells. Each convective cell may include one of the relevant precursors, and may be isolated from its neighbors. The compound material may be a Group III-V semiconductor or a Group II-VI material grown in a manner analogous to MOCVD or ALD, respectively. VJP may be differentiated from these techniques primarily by the capability of printing pinpoint features without the use of shadow masks or subtractive patterning. Other material sets may be possible for VJP, and any solid material that can be formed from two or more vaporized precursors may be used.

Organic Vapor Jet Printing (OVJP) may utilize a carrier gas to transport organic material from a heated source container to the print nozzle assembly which is in close proximity to a substrate. The nozzle assembly then forms the organic vapor into jets that condense onto well-defined zones of the substrate, allowing patterns to be generated in the resulting film. A micronozzle array, such as disclosed in U.S. Patent Publn. No. 2015/0376787, incorporated by reference herein, may utilize a combination of deposition apertures surrounded by exhaust apertures and a gas confinement flow to confine the line width and overspray. This arrangement may be referred to as DEC (Deposition-Exhaust-Confinement).

Figure 3A:
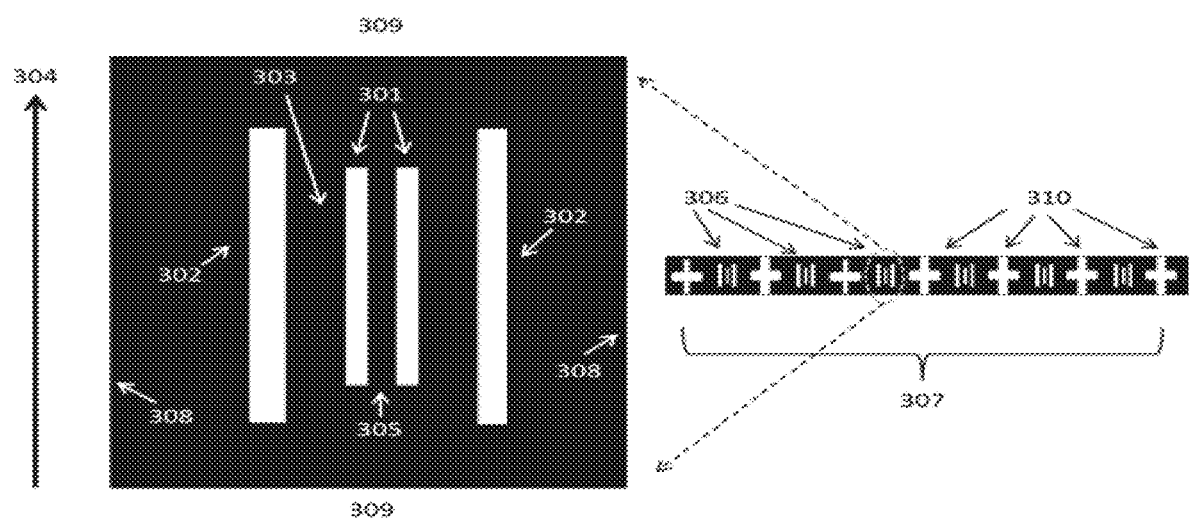
FIGS. 3A-3B show an OVJP (Organic Vapor Jet Printing) depositor, and a micronozzle array on which one or more OVJP depositors are arranged.
Figure 3B:
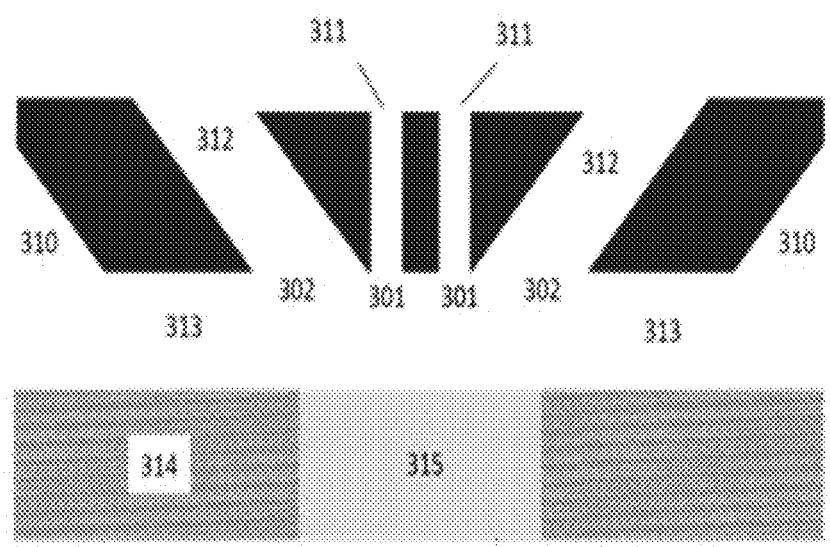

Overspray may be eliminated by using a flow of confinement gas to prevent the diffusion and transport of organic material away from a desired deposition region. Preferably, a chamber pressure range of 50 to 300 Torr may be used. FIGS. 3A-3B show an OVJP depositor, and a micronozzle array on which one or more OVJP depositors are arranged. A depositor design, shown from the perspective of the substrate in FIG. 3A, may include one or more rectangular delivery apertures 301 located between a pair of exhaust apertures 302. The flow through the delivery apertures 301 may include organic vapor entrained in an inert delivery gas. The exhaust apertures 302 may withdraw gas from the region under the depositor at a mass flow rate exceeding the delivery flow. The exhaust apertures 302 may remove the delivery flow and any surplus organic vapor entrained within it, as well as a balance of confinement gas drawn from the ambient surrounding the depositor. Delivery apertures 301 and exhaust apertures 302 may be separated by a width of a DE (Deposition-Exhaust) spacer 303. Delivery apertures 301 and exhaust apertures 302 may be arranged so that the long axes are parallel to the direction of printing 304. A solid section called the flow retarder 305 may be positioned between the delivery apertures 301 to modulate the delivery gas flux profile impinging onto the substrate (e.g., substrate 314 shown in FIG. 3B).

Depositors 306 may be arranged linearly on a micronozzle array 307, so that each depositor may border another on at least one of its side boundaries 308. The top and bottom edges 309 of the depositor are defined by the edges of a linear micronozzle array (e.g., micronozzle array 307 shown in FIG. 3A). Distribution channels 310 placed between depositors 306 may provide a source of confinement gas along the sides of each of the depositors 306. Alternately, confinement gas may flow in from the edges of the depositors 306, particularly if these channels are omitted. Micronozzle array 307 may be configured to minimize crosstalk between depositors 306 so that multiple printed features are as close to identical as possible across the width of the depositor array (e.g., the array of depositors 306 of the micronozzle array 307).

FIG. 3B shows a cross-section of a depositor (e.g., one of the depositors 306 shown in FIG. 3A). The channels shown in FIG. 3B may be etched into silicon and sealed on the top and bottom by wafer bonding techniques. Delivery channels 311 may carry organic vapor laden delivery gas to delivery apertures 301 that are surrounded on each side by exhaust apertures 302. The exhaust apertures 302 may connect to exhaust channels 312 that may remove excess vapor from the desired printing zone 315. Confinement gas may be fed into the sides of the depositor by the distribution channels 310. The confinement gas may sweep inward through the gap 313 created between the depositor and the substrate 314. The inward sweep of confinement gas driven by negative pressure at the exhaust aperture may prevent the flow of organic vapor laden gas from the delivery aperture from migrating beyond the desired printing zone 315. Organic vapor from the delivery aperture may adsorb to the substrate 314 within the printing zone to produce a well-defined thin film feature with no overspray beyond it.

Figure 4:
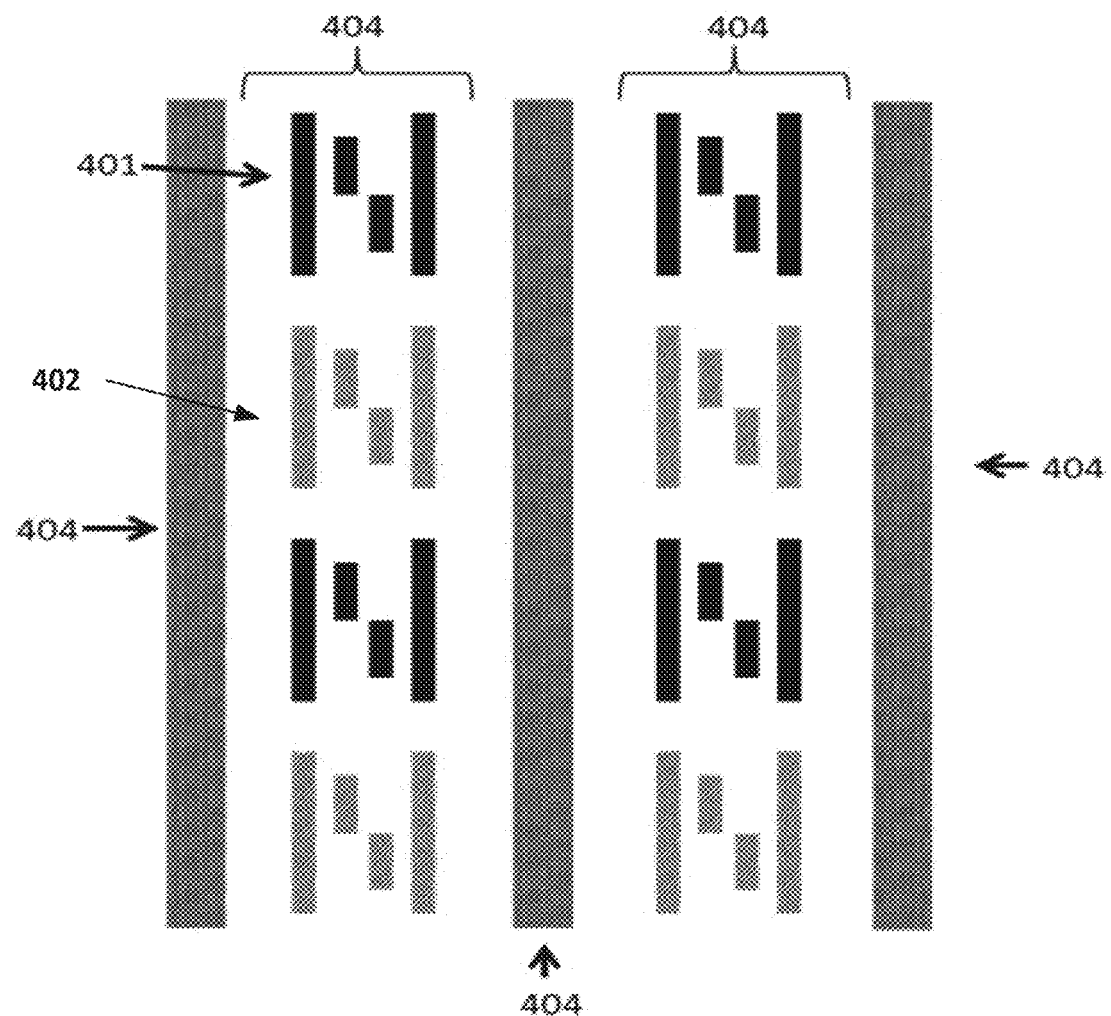
FIG. 4 shows a section of a micronozzle array having a plurality of time-stable DEC (Depositor-Exhaust-Confinement) VJP (Vapor Jet Printing) depositors according to an embodiment of the disclosed subject matter.

FIG. 4 shows a section of a micronozzle array having a time-stable DEC VJP depositors according to an embodiment of the disclosed subject matter. Depositors 401 may deposit reactant A, and depositors 402 may deposit reactant B. Each depositor 401, 402 may create a convective cell over the substrate. Depositors 401, 402 may be arranged in rows 403 of alternating depositor types with dispersed confinement gas sources 404 located between adjacent rows.

Figure 5:
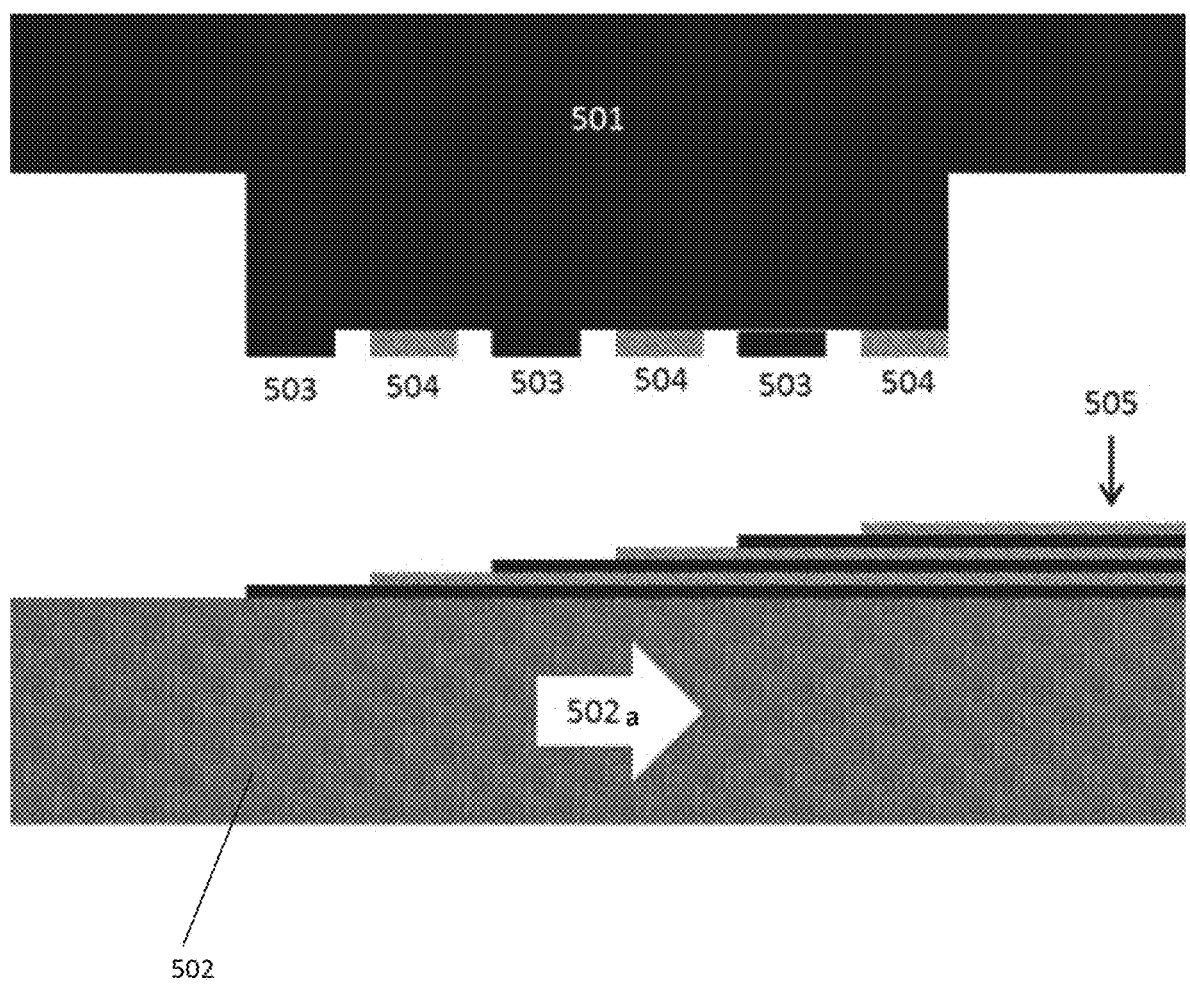
FIG. 5 shows a cross-section of a time stable DEC VJP micronozzle array printing a compound material onto a substrate according to an embodiment of the disclosed subject matter.

FIG. 5 shows a cross-section of a time stable DEC VJP micronozzle array printing a compound material onto a substrate according to an embodiment of the disclosed subject matter. A depositor array 501 having print heads and substrate 502 are show cross section in FIG. 5 parallel to the plane of the substrate 502 and perpendicular to the direction of motion 502a. If the depositor array 501 is moved linearly with respect to a substrate 502, discrete lines of deposition may form, corresponding to the rows on the print head. As the substrate 502 moves relative to the depositors, the printed zones on the substrate 502 may alternate between exposure to rows of convective cells 503 to deposit reactant A and convective cells 504 to deposit reactant B. This may result in the buildup of an ordered compound material 505.

Figure 6:
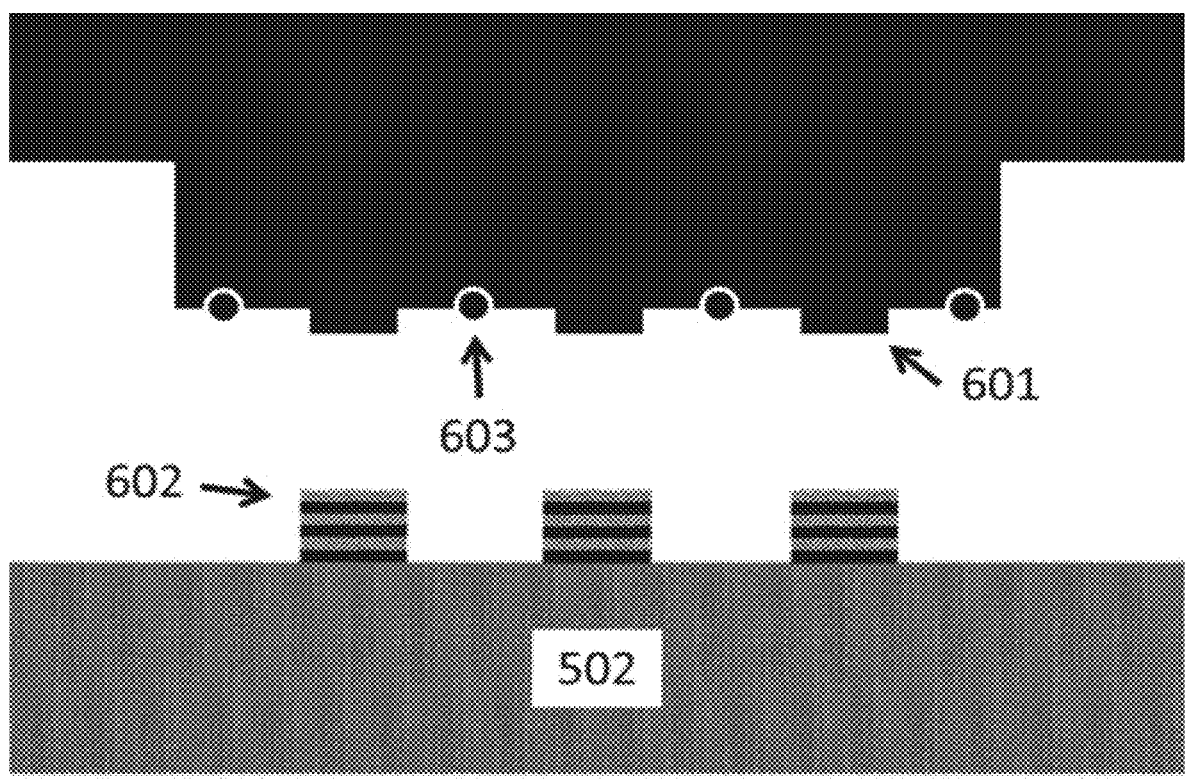
FIG. 6 shows a frontal section of a time stable DEC VJP micronozzle array printing a compound material onto a substrate according to an embodiment of the disclosed subject matter.

FIG. 6 shows a frontal section of a time stable DEC VJP micronozzle array printing a compound material onto a substrate according to an embodiment of the disclosed subject matter. The print head and substrate are illustrated in cross-section transverse to the direction of substrate motion. Each column of depositors 601 (orthogonal to rows) may correspond to a line of compound material 602. Confinement flow may be distributed between adjacent rows of depositors by porous tracks 603 in the print head that run parallel to the direction of substrate motion.

Figure 7:
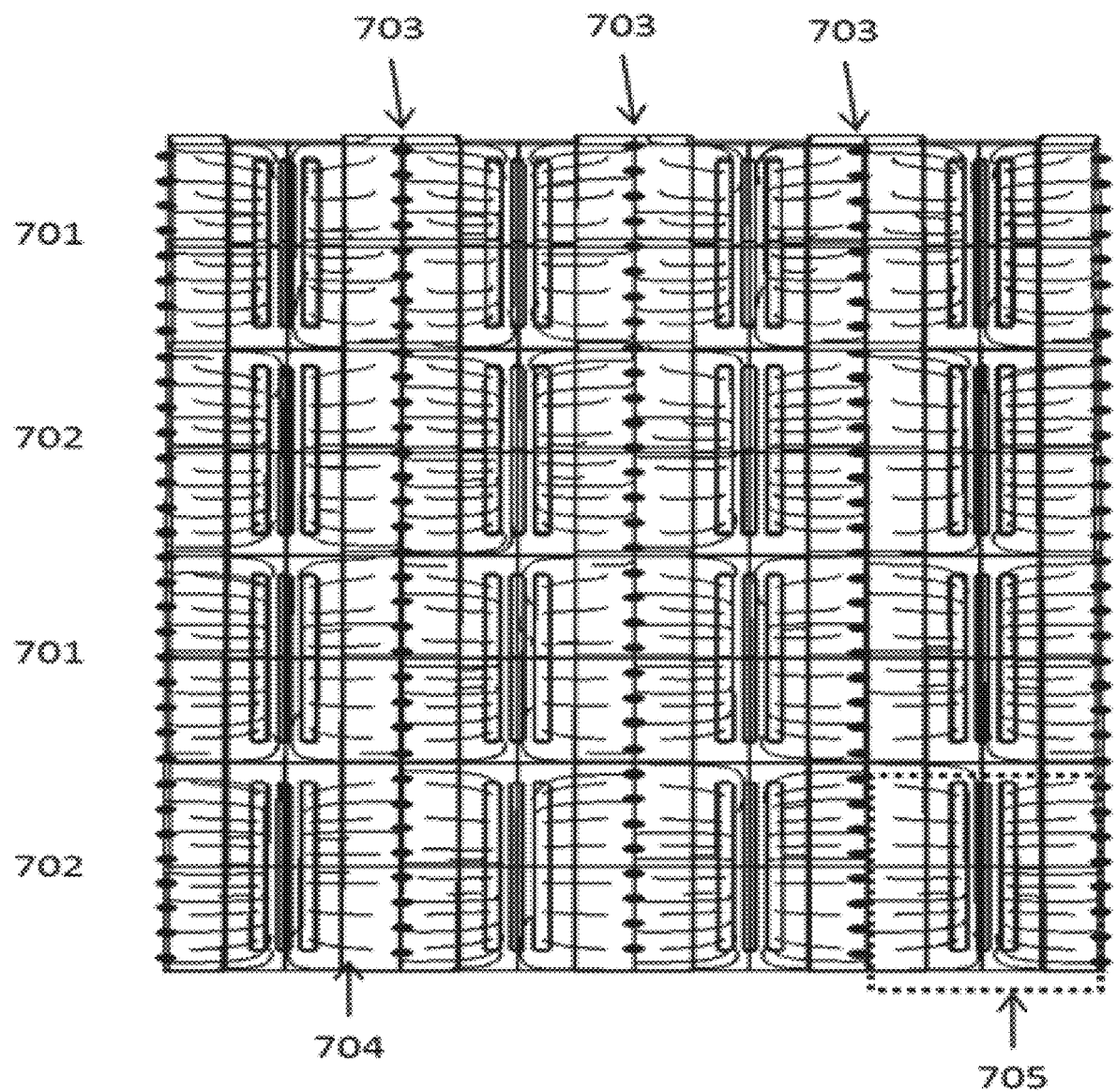
FIG. 7 shows streamlines of flow of process gasses for a time stable DEC VJP micronozzle array according to an embodiment of the disclosed subject matter.

FIG. 7 shows streamlines of flow of process gasses for a time stable DEC VJP micronozzle array according to an embodiment of the disclosed subject matter. That is, convective cells generated by the print head are shown in FIG. 7. The cells are arranged in a two-dimensional grid. In this particular configuration, rows 701 contain cells of vapor A and rows 702 contain cells of vapor B. In one configuration, depositors of varying types may be arranged in a checkerboard configuration. Confinement gas may be distributed through rows of nozzles 703 that run orthogonally to the rows 701, 702 of like material depositors. A positive pressure (relative to a chamber pressure) feed of confinement gas may be used to maintain uniformity for this ALD-VJP structure, since confinement gas may be evenly distributed to depositors that may be several rows deep within an array and do not share a perimeter with the chamber ambient.

The streamlines 704 generated by each depositor 705 may not cross into neighboring depositors. This may indicate that each depositor and the convective cell within it are isolated from its neighbors. A high level of uniformity between depositors may be obtained by a repeating array, since uniformity is equivalent to two-dimensional periodic symmetry in this context.

Figure 8:
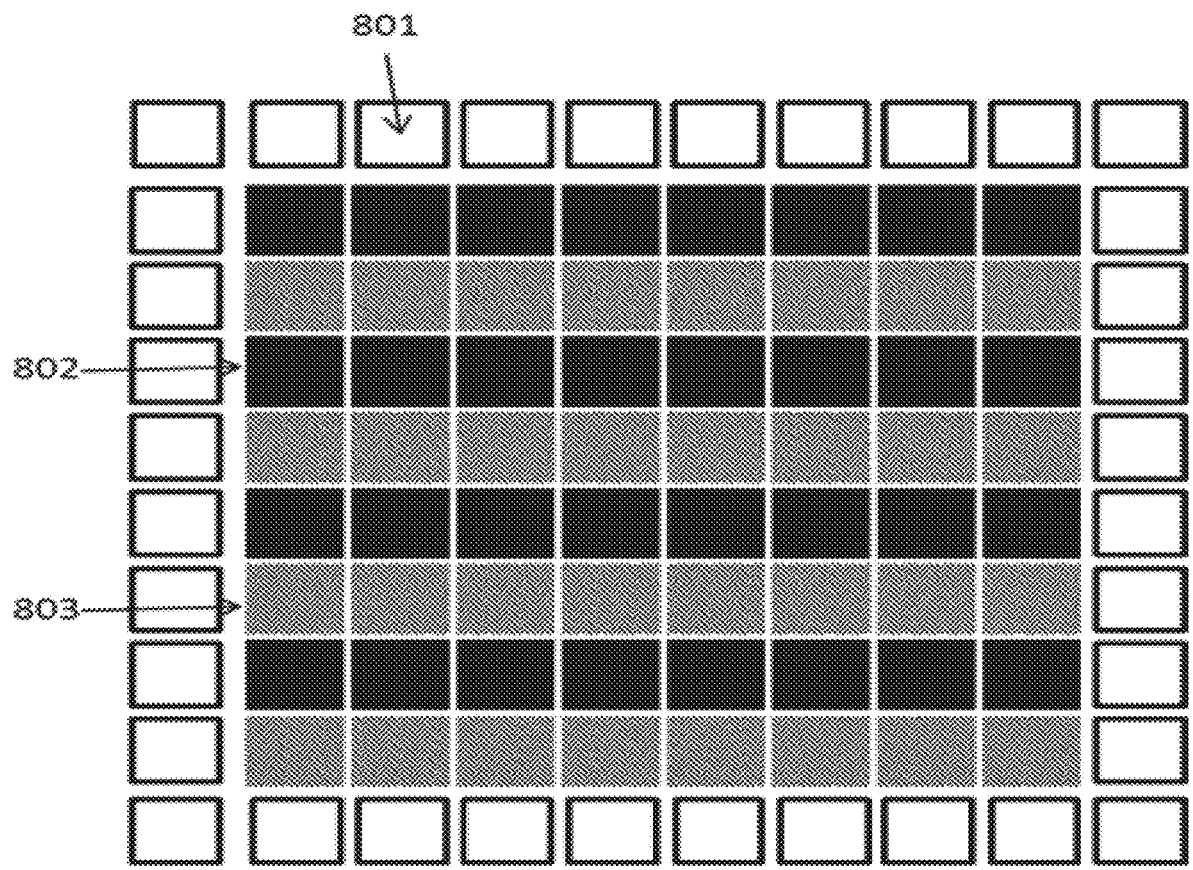
FIG. 8 shows a ring of inert convectors around a time stable DEC VJP micronozzle array according to an embodiment of the disclosed subject matter.

FIG. 8 shows a ring of inert convectors around a time stable DEC VJP micronozzle array according to an embodiment of the disclosed subject matter. As shown in FIG. 8, inert convectors 801 may surround the perimeter of a micro-nozzle array containing depositors jetting precursors 802 (precursor A) and precursor 803 (precursor B) to minimize edge effects. These inert convectors 801 may have exhaust and confinement flows but the delivery flow like depositors, if present, may not contain any reactive vapor.

Figure 9:
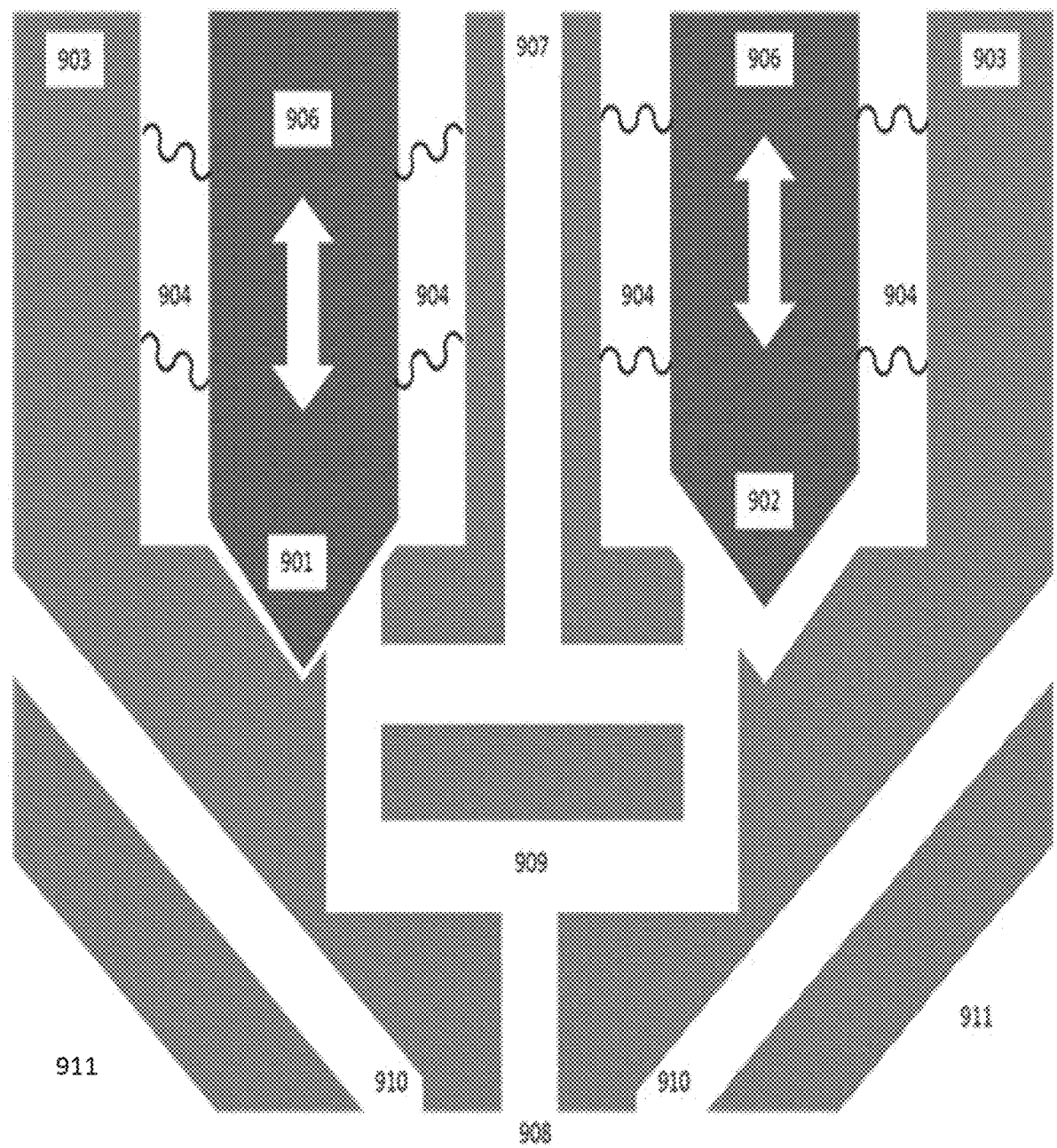
FIG. 9 shows a MEMS (Micro-Electro-Mechanical Systems) valve used in a time-variable DEC VJP micronozzle array according to an embodiment of the disclosed subject matter.

Micro-valves can be monolithically integrated into a VJP depositor array as described in U.S. patent application Ser. No. 16/243,393 filed Jan. 9, 2019, incorporated by reference herein, in its entirety. In addition to switching flow on and off, the valves can switch the source of flow feeding the delivery aperture between two sources of dissimilar vapor. FIG. 9 shows a MEMS (Micro-Electro-Mechanical Systems) valve used in a time-variable DEC VJP micronozzle array according to an embodiment of the disclosed subject matter. In particular, an example of a depositor within a valved print head is shown in a cross-section in FIG. 9. Two plug valves 901, 902 may be separated from their surrounding channels 903 by etching. The plug valves 901, 902 may be connected to the sidewalls of the channels 904 by flexures 905. The plug valves 901, 902 may be actuated by pushrods attached to the far ends of stems 906 that may be actuated by a piezoelectric array. A central channel 907 may feed a continuous stream of inert delivery gas that is not laden with a reactive vapor.

The left hand channel (i.e., the channel to the left of central channel 907) with a micro-valve (e.g., plug valve 901) may carry delivery gas with reactive species A. The right hand channel (i.e., the channel to the right of central channel 907) may carry delivery gas with reactive species B. When the left hand stem 906 is depressed and the right hand valve (e.g., plug valve 902 for the channel to the right of central channel 907) is not depressed, as shown in FIG. 9, vapor containing species B flows downward to the delivery aperture 908. Vapor with species A flows through the delivery aperture when the valve positions are reversed (i.e., when plug valve 902 is closed and plug valve 901 is open). Both stems 906 may be depressed so vapor flow from both channels is blocked by the plug valves 901, 902. This may be done to purge the delivery plenum 909 so that species A and B do not react within it. A feature made from compound material may be deposited by repeatedly cycling the valves 901, 902 (i.e., alternating the opening and closing of each valve independently) so that species A is jetted from the delivery aperture 908, then the delivery aperture 908 is purged, then species B is jetted form the delivery aperture 908, and the delivery aperture 908 is again purged, at which point the cycle repeats.

The depositor may include other features of the DEC depositor as discussed above. The delivery aperture may be flanked on both sides by exhaust channels 910 that remove unreacted vapor from the deposition zone. The confinement channels previously discussed may be replaced with "scallop" type transverse channels 911 that extend through the thickness of the micronozzle array and draw confinement gas from the chamber ambient. Due to the greater internal complexity of this structure, it may be more practical to arrange depositors abreast as shown in FIGS. 3A-3B, as opposed to in a two dimensional array as shown in FIG. 4. Since a single depositor can alternate material types, it may not be necessary to overfly a feature with multiple depositors. An advantage of a time-variable print head is that it may allow discontinuous features to be printed. Features printed by a time-stable print head may begin and end in the runout zone of the substrate. Otherwise, the beginning and end portions of the feature will be thinner than the central portions, since fewer depositors will pass over them. Another advantage of a time-variable print head is that the use of microvalves and close coupled exhaust may permit the switching of precursors with very small time constants. Since the growth rate is often limited by the time needed to switch between precursors for each atomic layer, this may greatly increase the overall deposition rate. Due to the very small volume of the delivery plenum, up to 3,000 complete cycles per second of A and B deposition, with intra-cycle purges, may be possible.

As shown in FIGS. 3A-9 and described above, a film (e.g., compound material 505, 605 shown in FIGS. 5-6) may be formed on a selective area of a substrate (e.g., substrate 502 shown in FIGS. 5-6). A first jet of a first material may be ejected from a first nozzle assembly (e.g., depositor 401 shown in FIG. 4, and/or convective cell 503 shown in FIG. 5 may eject reactant A) of a jet head comprising a plurality of nozzle assemblies to form a first portion of a film deposition on the substrate. A second jet of a second material may be ejected from a second nozzle assembly (e.g., depositor 402 shown in FIG. 4, and/or convective cell 504 shown in FIG. 5 may eject reactant B) of the plurality of nozzle assemblies, the second nozzle assembly being aligned with the first nozzle assembly parallel to a direction of motion between the plurality of nozzle assemblies and the substrate, and the second material being different than the first material. The second material may react with the first portion of the film deposition to form a composite film deposition (e.g., compound material 505 shown in FIG. 5, and/or compound material 602 shown in FIG. 6) on the substrate when using reactive gas precursors.

Each nozzle of the plurality of nozzle assemblies may include jetting apertures (e.g., delivery aperture 301 shown in FIG. 3), exhaust apertures (e.g., exhaust apertures 302 shown in FIG. 3), and confinement apertures (e.g., distribution channels 310 shown in FIG. 3), and a jetting flow ejected from the jetting apertures may be perpendicular to the substrate, and a confinement flow ejected from the confinement apertures may be parallel to the substrate. A shape and a thickness profile of the composite film deposition, and the selective area of the substrate upon which the composite film deposition is formed, may be based on a size and shape of the first nozzle assembly and the second nozzle assembly, and a distance between the jet head and the substrate.

The selective area of the substrate upon which the composite film deposition is formed may be less than 50% of the surface area of the substrate, and may be less than 10% of the surface area of the substrate. For example, the compound material 602s shown in FIG. 6 may be less than 50% of the surface area of the substrate 502. A size of the jet head may be less than 10% of a surface area of the substrate. For example, the size of each of the convective cells 503, 504 shown in FIG. 5 and/or the depositors 601 shown in FIG. 6 may be less than 10% of the surface area of the substrate 502. At least one of a length and width dimension of the jet head may be less than 25% of at least one of a length and width dimension of the substrate. As shown in FIGS. 5-6, the size of each of the convective cells 503, 504 and/or the depositors 601 may be less than 25% of the surface area of the substrate 502. The distance between the substrate and the jet head may be 10-100 µm, but may extend up to 1 mm for low resolution printing applications.

The composite film deposition (e.g., compound material 505 shown in FIG. 5, and/or compound material 602 shown in FIG. 6) may include at least one of an inorganic film, a metal film, and an organic film. The composite film deposition may be formed by using at least one of an atomic layer deposition (ALD), an atomic layer epitaxy (ALE), a chemical vapor deposition (CVD), plasma enhanced chemical vapor deposition (PECVD), and remote plasma enhanced chemical vapor deposition (RPECVD). The composite film deposition may form a multi-layer barrier film over at least a portion an organic light emitting device (OLED). The composite film deposition may include at least one of Group III-V materials. The Group III-V materials may be deposited using a showerhead having separate gas pathways for the Group III materials and the Group V materials. The composite film deposition may be formed from at least one of GaAs, AlAs, InGaAs, InP, InGaAlP, GaN, AlGaN, GaInN, and AlN. The composite film deposition may be a three-dimensional structure of at least one material selected from an organic material, an inorganic material, a metallic material, and a dielectric material. The composite film deposition may be a spatially-localized thin film transistor, a light emitting device, or an organic light emitting device.

One or more surface features may be detected, where the composite film deposition (e.g., compound material 505 shown in FIG. 5, and/or compound material 602 shown in FIG. 6) is formed on the one or more detected surface features of the device. One of the detected surface features may be a surface defect.

In some embodiments, films (e.g., compound material 505, 605 shown in FIGS. 5-6) may be deposited on a selective area of a substrate (e.g., substrate 502 shown in FIGS. 5-6) that rely on different source gases that react at or close to a deposition site (e.g., desired printing zone 315 shown in FIG. 3B). A first jet of a first material may be ejected from a first nozzle assembly (e.g., depositor 401 shown in FIG. 4, and/or convective cell 503 shown in FIG. 5 may eject reactant A) of a jet head that is separate from a second nozzle assembly (e.g., depositor 402 shown in FIG. 4, and/or convective cell 504 shown in FIG. 5 may eject reactant B) of the jet head. On a surface of the substrate (e.g., substrate 502 shown in FIGS. 5-6), a first layer deposition may be formed using the first material. The substrate or the jet head may be moved a distance (e.g., in direction 502a shown in FIG. 5) corresponding to a spacing between the first nozzle assembly and the second nozzle assembly. A second jet of a second material may be ejected from the second nozzle assembly (e.g., depositor 402 shown in FIG. 4, and/or convective cell 504 shown in FIG. 5 may eject reactant B) of the jet head. The second nozzle assembly may be aligned with the first nozzle assembly parallel to a direction of motion (e.g., direction 502a shown in FIG. 5) between the plurality of nozzle assemblies and the substrate. The second material may react with the first portion of the film deposition to form a composite film deposition (e.g., compound material 505 shown in FIG. 5, and/or compound material 602 shown in FIG. 6) on the substrate when using reactive gas precursors.

The first nozzle assembly and the second nozzle assembly may be confined from one another. Each nozzle of a plurality of nozzle assemblies of the jet head may include jetting apertures (e.g., delivery aperture 301 shown in FIG. 3), exhaust apertures (e.g., exhaust apertures 302 shown in FIG. 3), and confinement apertures (e.g., distribution channels 310 shown in FIG. 3), and a jetting flow ejected from the jetting apertures may be perpendicular to the substrate (e.g., substrate 502 shown in FIGS. 5-6), and a confinement flow ejected from the confinement apertures may be parallel to the substrate. A shape and a thickness profile of the composite film deposition, and the selective area of the substrate upon which the composite film deposition is formed, may be based on a size and shape of the first nozzle assembly and the second nozzle assembly, and a distance between the jet head and the substrate.

The substrate or the jet head may be moved the distance (e.g., in direction 502a shown in FIG. 5) corresponding to the spacing between the first nozzle assembly and the second nozzle assembly (e.g., the space between depositors 401 and 402 shown in FIG. 4, or the space between convective cell 503 and convective cell 504 shown in FIG. 5). The composite film deposition (e.g., compound material 505 shown in FIG. 5, and/or compound material 602 shown in FIG. 6) may be added to using the first material that is emitted from the first nozzle assembly (e.g., depositor 401 shown in FIG. 4, and/or convective cell 503 shown in FIG. 5).

The first nozzle assembly (e.g., depositor 401 shown in FIG. 4, and/or convective cell 503 shown in FIG. 5) and the second nozzle assembly (e.g., depositor 402 shown in FIG. 4, and/or convective cell 503 shown in FIG. 5) may form a nozzle assembly pair, where a number of nozzle assembly pairs of the plurality of nozzle assemblies may be equal to a film thickness divided by a bi-layer atom thickness.

In some embodiments, a film (e.g., compound material 505, 605 shown in FIGS. 5-6) may be deposited on a selective area of an object (e.g., substrate 502 shown in FIGS. 5-6, or a device), where there is switching between a source for a first gas (e.g., reactant A that may be ejected from depositor 401 shown in FIG. 4, and/or convective cell 503 shown in FIG. 5) and a second gas (e.g., reactant B may be ejected by depositor 402 shown in FIG. 4, and/or convective cell 504 shown in FIG. 5). The first gas may be ejected from a first nozzle assembly (e.g., depositor 401 shown in FIG. 4, and/or convective cell 503 shown in FIG. 5) of a jet head having a plurality of nozzle assemblies, and the second gas may be ejected from a second nozzle assembly (e.g., depositor 402 shown in FIG. 4, and/or convective cell 504 shown in FIG. 5) of the jet head, where the second nozzle assembly is aligned with the first nozzle assembly parallel to a direction of motion between the plurality of nozzle assemblies and the object. On a surface of the object, a composite film deposition (e.g., compound material 505 shown in FIG. 5, and/or compound material 602 shown in FIG. 6) may be formed by alternating the exposure of the surface of the object to the first gas and the second gas by the switching, where the composite film deposition is formed using reactive gas precursors.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of depositing a film on a selective area of a substrate, the method comprising:

ejecting a first jet of a first material from a first nozzle assembly of a jet head comprising a plurality of nozzle assemblies to form a first portion of a film deposition on the substrate; and ejecting a second jet of a second material from a second nozzle assembly of the plurality of nozzle assemblies, the second nozzle assembly being aligned with the first nozzle assembly parallel to a direction of motion between the plurality of nozzle assemblies and the substrate, and the second material being different than the first material, wherein the second material reacts with the first portion of the film deposition to form a composite film deposition on the substrate when using reactive gas precursors.

2. The method of claim 1, wherein each nozzle of the plurality of nozzle assemblies is comprised of jetting apertures, exhaust apertures, and confinement apertures, and a jetting flow ejected from the jetting apertures is perpendicular to the substrate, and a confinement flow ejected from the confinement apertures is parallel to the substrate.

3. The method of claim 1, wherein a shape and a thickness profile of the composite film deposition, and the selective area of the substrate upon which the composite film deposition is formed, is based on a size and shape of the first nozzle assembly and the second nozzle assembly, and a distance between the jet head and the substrate.

4. The method of claim 1, wherein the selective area of the substrate upon which the composite film deposition is formed selected from the group consisting of: less than 50% of the surface area of the substrate, and less than 10% of the surface of the substrate.

5. The method of claim 1, wherein a size of the jet head is less than 10% of a surface area of the substrate.

6. The method of claim 1, wherein at least one of a length and width dimension of the jet head is less than 25% of at least one of a length and width dimension of the substrate.

7. The method of claim 1, wherein the distance between the substrate and the jet head is selected from the group consisting of: 10-100 µm, and 100 µm 1 mm.

8. The method of claim 1, wherein the composite film deposition includes at least one from the group consisting of: an inorganic film, a metal film, and an organic film.

9. The method of claim 1, wherein the composite film deposition is formed using at least one selected from the group consisting of: an atomic layer deposition (ALD), an atomic layer epitaxy (ALE), a chemical vapor deposition (CVD), plasma enhanced chemical vapor deposition (PECVD), and remote plasma enhanced chemical vapor deposition (RPECVD).

10. The method of claim 1, wherein the composite film deposition forms a multi-layer barrier film over at least a portion of an organic light emitting device (OLED).

11. The method of claim 1, wherein the composite film deposition comprises at least one of Group III-V materials.

12. The method of claim 11, wherein the Group III-V materials are deposited using a showerhead having separate gas pathways for the Group III materials and the Group V materials.

13. The method of claim 1, wherein the composite film deposition is formed from at least one of the materials selected from the group consisting of: GaAs, AlAs, InGaAs, InP, InGaAlP, GaN, AlGaN, GaInN, and AlN.

14. The method of claim 1, wherein the composite film deposition is a three-dimensional structure of at least one material selected from the group consisting of: organic material, inorganic material, metallic material, and dielectric material.

15. The method of claim 1, further comprising:
detecting, with a sensor, one or more surface features of a device,
wherein the composite film deposition is formed on the one or more detected surface features of the device.

16. The method of claim 15, wherein one of the detected surface features is a surface defect.

17. The method of claim 1, wherein the composite film deposition is selected from the group consisting of: a spatially-localized thin film transistor, a light emitting device, and an organic light emitting device.

18. A device to deposit a film on a selective area of a substrate, the device comprising:
a jet head having a plurality of nozzle assemblies, comprising:
a first nozzle assembly to eject a first jet of a first material to form a first portion of a film deposition on the substrate; and
a second nozzle assembly to eject a second jet of a second material, the second nozzle assembly being aligned with the first nozzle assembly parallel to a direction of motion between the plurality of nozzle assemblies and the substrate, and the second material being different than the first material,
wherein the second material reacts with the first portion of the film deposition to form a composite film deposition on the substrate when using reactive gas precursors.

19. The device of claim 18, wherein each nozzle of the plurality of nozzle assemblies is comprised of jetting apertures, exhaust apertures, and confinement apertures, and a jetting flow ejected from the jetting apertures is perpendicular to the substrate, and a confinement flow ejected from the confinement apertures is parallel to the substrate.

20. A method of depositing films on a selective area of a substrate that rely on different source gases that react at or close to a deposition site, the method comprising:
ejecting a first jet of a first material from a first nozzle assembly of a jet head that is separate from a second nozzle assembly of the jet head;
forming, on a surface of the substrate, a first layer deposition using the first material;
moving the substrate or the jet head a distance corresponding to a spacing between the first nozzle assembly and the second nozzle assembly; and
ejecting a second jet of a second material from the second nozzle assembly of the jet head, wherein the second nozzle assembly is aligned with the first nozzle assembly parallel to a direction of motion between the plurality of nozzle assemblies and the substrate,
wherein the second material reacts with the first portion of the film deposition to form a composite film deposition on the substrate when using reactive gas precursors.

* * * * *